(12) United States Patent
Yang et al.

(10) Patent No.: US 10,361,235 B2
(45) Date of Patent: Jul. 23, 2019

(54) IMAGE SENSOR

(71) Applicant: Industrial Technology Research Institute, Hsinchu (TW)

(72) Inventors: Sheng-Shu Yang, Hsinchu (TW); Hsiang-Hung Chang, Hsinchu County (TW)

(73) Assignee: Industrial Technology Research Institute, Hsinchu (TW)

(*) Notice: Subject to any disclaimer, the term of this patent is extended or adjusted under 35 U.S.C. 154(b) by 81 days.

(21) Appl. No.: 15/391,867

(22) Filed: Dec. 28, 2016

(65) Prior Publication Data

US 2018/0145106 A1 May 24, 2018

(30) Foreign Application Priority Data

Nov. 23, 2016 (TW) .............................. 105138514 A

(51) Int. Cl.
*H01L 27/146* (2006.01)
(52) U.S. Cl.
CPC .. *H01L 27/14636* (2013.01); *H01L 27/14607* (2013.01); *H01L 27/14618* (2013.01); *H01L 27/14643* (2013.01)
(58) Field of Classification Search
CPC ....... H01L 27/14618; H01L 27/14603–14616; H01L 27/146–14893; H01L 31/0203; H01L 31/0232; H01L 31/048; H01L 31/054; H01L 31/02325; H01L 31/0216–02168; H01L 27/14601; H01L 21/14607; H01L 27/14625
USPC ...................................................... 257/433
See application file for complete search history.

(56) References Cited

U.S. PATENT DOCUMENTS

| | | | |
|---|---|---|---|
| 6,486,917 B2 | 11/2002 | Iwasaki | |
| 6,791,072 B1 | 9/2004 | Prabhu | |
| 7,190,039 B2 | 3/2007 | Boettiger et al. | |
| 7,397,066 B2 | 7/2008 | Oliver | |
| 7,696,588 B2 | 4/2010 | Boettiger et al. | |
| 7,791,190 B2 | 9/2010 | Flores et al. | |
| 7,923,793 B2 | 4/2011 | Choi et al. | |
| 8,857,490 B2 | 10/2014 | Sung et al. | |
| 8,932,894 B2 | 1/2015 | Christophersen et al. | |
| 9,099,604 B2 | 8/2015 | Roy et al. | |
| 9,244,253 B2 | 1/2016 | Chen et al. | |

(Continued)

FOREIGN PATENT DOCUMENTS

| | | |
|---|---|---|
| CN | 105045348 | 11/2015 |
| EP | 1132967 | 9/2001 |

(Continued)

OTHER PUBLICATIONS

Reshidko et al., "Current trends in miniature camera lens technology", 2016 SPIE Newsroom, Feb. 19, 2016, pp. 1-3.

(Continued)

*Primary Examiner* — Daniel Whalen
*Assistant Examiner* — Suberr L Chi
(74) *Attorney, Agent, or Firm* — JCIPRNET

(57) ABSTRACT

An image sensor including a substrate, an image sensing element, and an adhesive layer is provided. The substrate has an arc surface. The image sensing element is disposed on the arc surface and curved to fit the contour of the arc surface. The adhesive layer is disposed on the arc surface and encapsulates the image sensing element.

16 Claims, 6 Drawing Sheets

(56) References Cited

U.S. PATENT DOCUMENTS

| | | | |
|---|---|---|---|
| 9,349,763 | B1 | 5/2016 | Lin et al. |
| 9,570,488 | B2 * | 2/2017 | McKnight ......... H01L 27/14607 |
| 2001/0020671 | A1 | 9/2001 | Ansorge et al. |
| 2004/0095502 | A1 | 5/2004 | Losehand et al. |
| 2007/0228502 | A1 * | 10/2007 | Minamio .......... H01L 27/14618 257/431 |
| 2009/0115875 | A1 * | 5/2009 | Choi ................. H01L 27/14618 348/294 |
| 2011/0140283 | A1 * | 6/2011 | Chandra ............. H01L 23/5385 257/777 |
| 2012/0217606 | A1 * | 8/2012 | Itonaga ............... H01L 31/0203 257/443 |
| 2014/0004644 | A1 | 1/2014 | Roy et al. |
| 2014/0064667 | A1 | 3/2014 | Isenhour et al. |
| 2014/0160327 | A1 | 6/2014 | Enoki et al. |
| 2015/0001111 | A1 * | 1/2015 | Wong ................ H01L 27/14618 206/316.1 |
| 2015/0034809 | A1 | 2/2015 | Droz et al. |
| 2015/0035133 | A1 * | 2/2015 | Wong ....................... H01L 23/04 257/704 |
| 2015/0334324 | A1 * | 11/2015 | Hashimoto ............ H04N 5/374 257/432 |
| 2016/0286102 | A1 * | 9/2016 | Sulfridge ............. H04N 5/2253 |
| 2016/0295139 | A1 * | 10/2016 | Ishii ..................... H04N 5/3696 |
| 2016/0351607 | A1 * | 12/2016 | Liu ................... H01L 27/14618 |

FOREIGN PATENT DOCUMENTS

| | | |
|---|---|---|
| JP | 2012182194 | 9/2012 |
| TW | 201616310 | 5/2016 |
| TW | 201637186 | 10/2016 |
| WO | WO 2015/146332 A1 * | 10/2015 |

OTHER PUBLICATIONS

Itonaga et al., "A Novel Curved CMOS Image Sensor Integrated with Imaging System", 2014 Symposium on VLSI Technology Digest of Technical Papers, Jun. 2014, pp. 1-2.

"Office Action of Taiwan Counterpart Application," dated Aug. 29, 2017, p. 1-p. 7, in which the listed references were cited.

* cited by examiner

IMAGE SENSOR

CROSS-REFERENCE TO RELATED APPLICATION

This application claims the priority benefit of Taiwan application serial no. 105138514, filed on Nov. 23, 2016. The entirety of the above-mentioned patent application is hereby incorporated by reference herein and made a part of this specification.

TECHNICAL FIELD

The disclosure relates to an image sensor; more particularly, the disclosure relates to an image sensor with a curved image sensing element.

BACKGROUND

With a rapid progress in multimedia technology in recent years, digital images have been widely used, and therefore demands for image processing devices from consumers are on the rise day by day. Various digital image products, such as web cameras, digital cameras, and smart phones, retrieve images through image sensors.

A complementary metal oxide semiconductor (CMOS) image sensing element may be designed to be curved to change its optical characteristics, so as to reduce the number of corresponding lenses required and to achieve miniaturization of image sensing modules. Generally speaking, the image sensing element that has not yet been curved is disposed on an arc surface of a substrate. The substrate has a through hole at the arc surface, and the through hole is below the image sensing element. Then, the image sensing element is forced to be curved downwards and attached to the arc surface of the substrate by extracting air through the through hole, so as to obtain a curved image sensing element. Nevertheless, the through hole arranged for air extraction has to be formed in the substrate first, which requires more time and effort as a result. Moreover, the structure of the substrate is not strong enough to firmly support the image sensing element because of the through hole, thus leading to unexpected deformation at the through hole of the image sensing element. In addition, in a general image sensing module, since the image sensing element is not encapsulated by any adhesive, the image sensing element is prone to be attached by foreign substances (e.g., dusts in the environment) during its manufacture, and the quality of the image sensing module is thus reduced.

SUMMARY

An image sensor is introduced herein by the disclosure to save manufacturing costs, thinly support the image sensing element, and prevent foreign substances from being attached to the image sensing element during the manufacturing process.

In an embodiment of the disclosure, an image sensor includes a substrate, an image sensing element, and an adhesive layer. The substrate has an arc surface. The image sensing element is disposed on the arc surface and curved to fit a contour of the arc surface. The adhesive layer is disposed on the arc surface and encapsulates the image sensing element.

In view of the foregoing, in the image sensor of the disclosure, not only the image sensing element but also the adhesive layer encapsulating the image sensing element is disposed on the arc surface of the substrate. Therefore, during a process of pressing the image sensing element and the adhesive layer onto the arc surface of the substrate, the adhesive layer pushes against the image sensing element, and the image sensing element may thus be curved to fit the contour of the arc surface. Compared to the conventional image sensing element that is curved by air extraction, the image sensing element in the disclosure requires no through hole to be formed on the arc surface of the substrate, thus simplifying the manufacturing process and saving the manufacturing costs. In addition, in view of the foregoing, since no through hole has to be formed on the substrate in the disclosure, a structure of the substrate is intact and thus is able to firmly support the image sensing element. Furthermore, since the image sensing element is encapsulated by the adhesive layer, foreign substances are prevented from being attached to the image sensing element during the manufacturing process.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DETAILED DESCRIPTION OF DISCLOSURED EMBODIMENTS

Figure 1A:
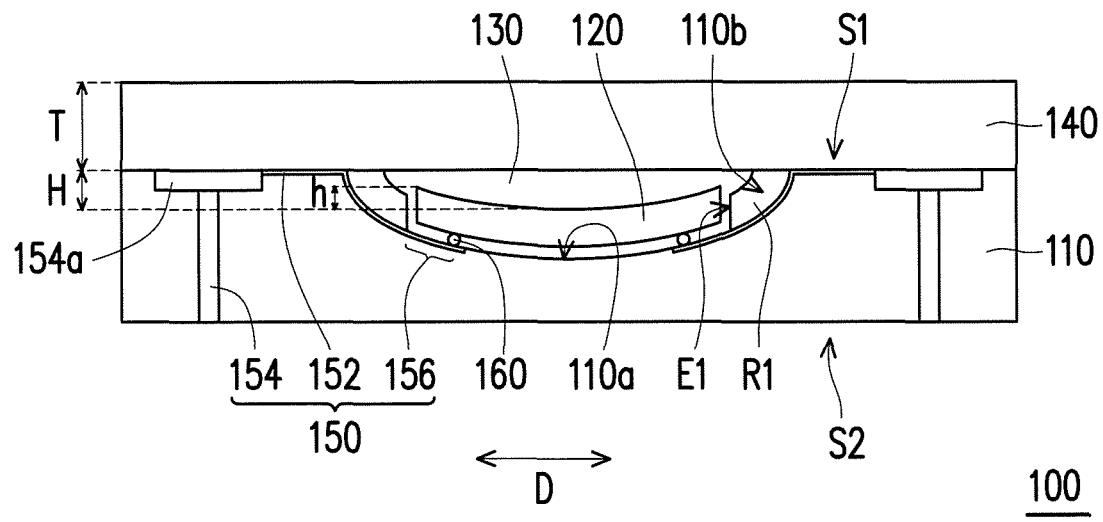
FIG. 1A is a cross-sectional view illustrating an image sensor according to an exemplary embodiment of the disclosure.

FIG. 1A is a cross-sectional view illustrating an image sensor according to an exemplary embodiment of the disclosure. Referring to FIG. 1A, the embodiment provides an image sensor 100 that includes a substrate 110, an image sensing element 120, an adhesive layer 130, and a cover 140. The substrate 110 has an arc surface 110a, and the image sensing element 120 is disposed on the arc surface 110a of the substrate 110. The image sensing element 120 is thus curved to fit the contour of the arc surface 110a of the substrate 110. The adhesive layer 130 is disposed on the arc surface 110a of the substrate 110 and encapsulates the image sensing element 120. The cover 140 is disposed on the substrate 110 and covers the image sensing element 120 and the adhesive layer 130. The embodiment provides that the image sensing element 120 is, for example, a complementary metal oxide semiconductor (CMOS) image sensing element, but the disclosure is not limited thereto.

Specifically, the embodiment provides that the substrate 110 has an upper side S1 and a lower side S2 opposite to the upper side. The arc surface 110a is located on the upper side S1 of the substrate 110, and the arc surface 110a, as shown in FIG. 1A, is a concave arc surface which forms a groove on the substrate 110. The image sensing element 120 is disposed in the groove, the adhesive layer 130 fills the groove, and a curvature of the image sensing element 120 is substantially identical to a curvature of the arc surface 110a. Another embodiment provides that the arc surface 110a may also be a convex arc surface where the image sensing element 120 is disposed, and the disclosure is not limited thereto.

In view of the foregoing, not only the image sensing element 120 but also the adhesive layer 130 encapsulating the image sensing element 120 is disposed on the arc surface 110a of the substrate 110. Therefore, during a process of pressing the image sensing element 120 and the adhesive layer 130 onto the arc surface 110a of the substrate 110, the adhesive layer 130 pushes against the image sensing element 120, and the image sensing element 120 may thus be curved to fit the contour of the arc surface 110a. Compared to the conventional image sensing element that is curved by air extraction, the image sensing element 120 in the disclosure requires no through hole to be formed on the arc surface 110a of the substrate 110, thus simplifying the manufacturing process and saving the manufacturing costs. In addition, in view of the foregoing, since no through hole has to be formed on the substrate 110 in the disclosure, a structure of the substrate 110 is intact and thus may firmly support the image sensing element 120. Furthermore, the image sensing element 120 is encapsulated by the adhesive layer 130, and foreign substances are thus prevented from being attached to the image sensing element 120 during the manufacturing process.

Referring to FIG. 1A, a maximum distance H between a top surface of the image sensing element 120 and the cover 140 is, for example, smaller than a thickness T of the cover 140 according to the exemplary embodiment. For instance, the distance H is 12.5 microns to 100 microns, and the thickness T is 200 microns to 100 microns. A height difference h of the top surface of the image sensing element 120 in a vertical direction in FIG. 1A is, for example, greater than 12.5 microns, but the disclosure is not limited thereto.

Figure 1B:
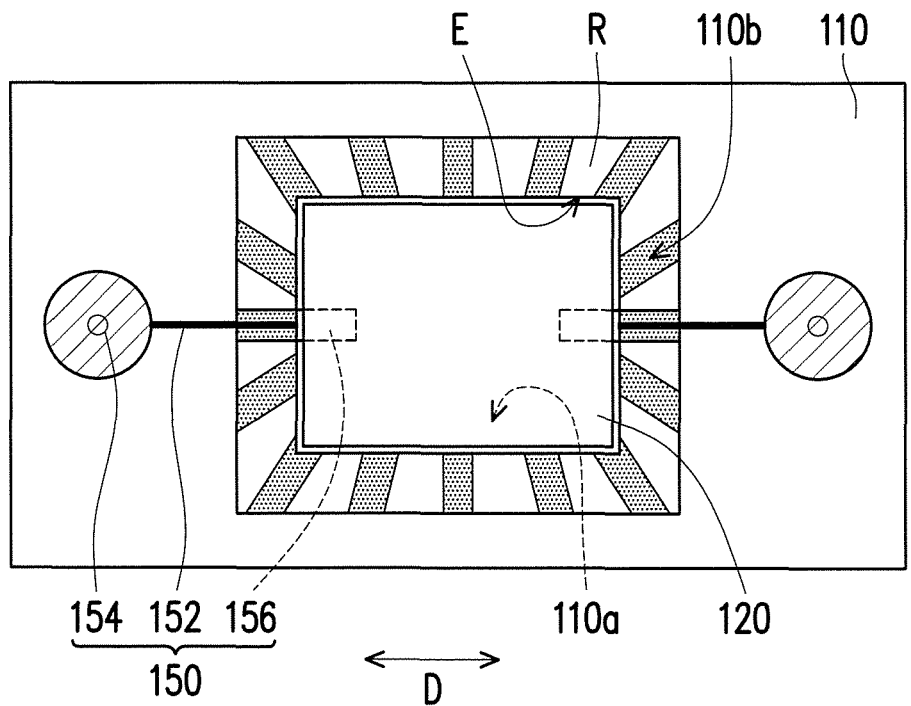
FIG. 1B is a top view illustrating a portion of elements of the image sensor in FIG. 1A.

FIG. 1B is a top view illustrating a portion of elements of the image sensor in FIG. 1A. For the sake of clearness of the drawing, the adhesive layer 130, the cover 140, and the conductive element 160 in FIG. 1A are not shown in FIG. 1B. Referring to FIG. 1A and FIG. 1B, the substrate 110 in the embodiment has at least one groove 110b for overflowed adhesive (shown as a plurality of grooves for overflowed adhesive), and the grooves 110b for overflowed adhesive extends from a periphery of the image sensing element 120 to an edge of the arc surface 110a, such that the superfluous adhesive generated during a process of forming the adhesive layer 130 may be removed through the groove 110b for overflowed adhesive. Specifically, the arc surface 110a in the embodiment has a plurality of flanges R1 surrounding the image sensing element 120, and the flanges R1 are arranged with intervals to form the grooves 110b for overflowed adhesive. In addition, ends E1 of the flanges R1 surround the image sensing element 120 and form a positioning recess, and the image sensing element 120 is positioned in the positioning recess formed by the ends E1 of the flanges R1.

The embodiment provides that a contour of the arc surface 110a is a rectangle as shown in FIG. 1B, and the positioning recess formed by the ends E1 of the flanges R1 is also a rectangle as shown in FIG. 1B; however, the disclosure in not limited thereto. Another embodiment provides that the contour of the arc surface 110a may be a circle or other suitable shape, and the positioning recess formed by the ends E1 of the flanges R1 may also be a circle or other suitable shape. In addition, the embodiment provides that the arc surface 110a has an arc merely in a direction D, but the disclosure is not limited thereto, and another embodiment provides that the arc surface 110a may further have arcs in other directions and thus form a bowl-shaped groove.

As illustrated in FIG. 1A and FIG. 1B, the image sensor 100 includes a conductive structure 150 disposed on the substrate 110 and electrically connected to the image sensing element 120, and the conductive structure 150 extends from a bottom of the image sensing element 120 to the outside of the arc surface 110a, such that signals may be transmitted by the image sensing element 120 through the conductive structure 150. Specifically, the image sensor 100 includes at least one conductive element 160 (two are shown), and the conductive structure 150 includes at least one conductive circuit 152 (two are shown), at least one conductive plug 154 (two are shown, e.g., a through silicon via (TSV)), and at least one contact pad 156 (two are shown). The conductive element 160 is, for example, a conductive bump and is disposed between the image sensing element 120 and the arc surface 110a, and the two conductive elements 160 are electrically connected to the image sensing element 120 and are electrically connected to the conductive structure 150 and the two contact pads 156, respectively. The two contact pads 156 are disposed on the arc surface 110a and are electrically connected to the two conductive circuits 152 respectively. The two conductive circuits 152 extend from the inside of the arc surface 110a to the outside of the arc surface 110a along the upper side S1 of the substrate 110 and are connected to the two conductive plugs 154, respectively. Each conductive plug 154 is connected to the corresponding conductive circuit 152 through the contact pad 154a located on the upper side S1 of the substrate 110 and penetrates the substrate 110 from the outside of the arc surface 110a to the lower side S2 of the substrate 110. The embodiment provides that each conductive circuit 152 of the conductive structure 150, for example, extends along the groove 110b for overflowed adhesive to the outside of the arc surface 110a, but the disclosure is not limited thereto.

Figure 2:
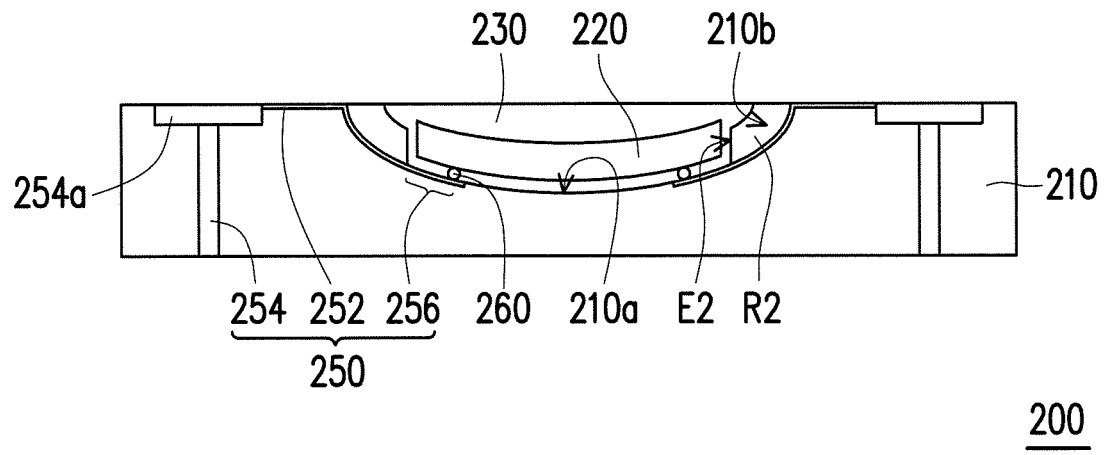
FIG. 2 is a cross-sectional view illustrating an image sensor according to another exemplary embodiment of the disclosure.

FIG. 2 is a cross-sectional view illustrating an image sensor according to another exemplary embodiment of the disclosure. The exemplary embodiment as illustrated in FIG. 2 provides that a substrate 210, an arc surface 210a, an groove 210b for overflowed adhesive, an image sensing element 220, an adhesive layer 230, a conductive structure 250, a conductive circuit 252, a conductive plug 254, a contact pad 254a, a contact pad 256, a conductive element 260, a flange R2, and an end E2 are disposed and operated in a manner similar to that of the substrate 110, the arc surface 110a, the groove 110b for overflowed adhesive, the image sensing element 120, the adhesive layer 130, the conductive structure 150, the conductive circuit 152, the conductive plug 154, the contact pad 154a, the contact pad 156, the conductive element 160, the flange R1, and the end E1 shown in FIG. 1A. Thus, details are not repeated hereinafter. A difference between an image sensor 200 and the image sensor 100 is that, unlike what is shown in FIG. 1A, the image sensor 200 is not equipped with the cover 140 for covering the image sensing element 120 and the adhesive layer 130.

Figure 3A:
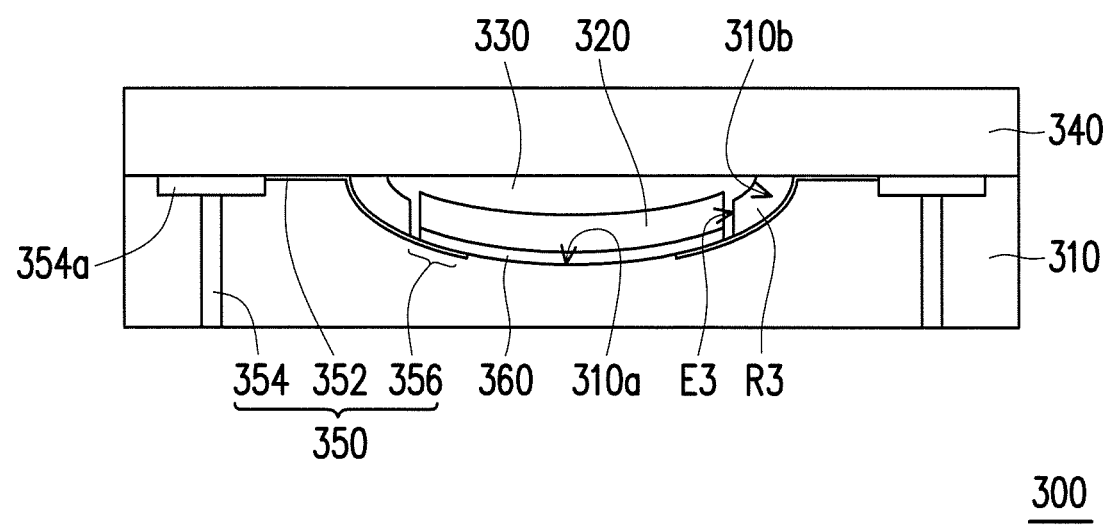
FIG. 3A is a cross-sectional view illustrating an image sensor according to another exemplary embodiment of the disclosure.

FIG. 3A is a cross-sectional view illustrating an image sensor according to another exemplary embodiment of the disclosure. The exemplary embodiment as illustrated in FIG. 3A provides that a substrate 310, an arc surface 310a, an groove 310b for overflowed adhesive, an image sensing element 320, an adhesive layer 330, a cover 340, a conductive structure 350, a conductive circuit 352, a conductive plug 354, a contact pad 354a, a contact pad 356, a conductive element 360, a flange R3, and an end E3 are disposed and operated in a manner similar to that of the substrate 110, the arc surface 110a, the groove 110b for overflowed adhesive, the image sensing element 120, the adhesive layer 130, the cover 140, the conductive structure 150, the conductive circuit 152, the conductive plug 154, the contact pad 154a, the contact pad 156, the conductive element 160, the flange R1, and the end E1 shown in FIG. 1A. Thus, details are not repeated hereinafter. A difference between an image sensor 300 and the image sensor 100 is that, unlike the conductive element 160 in FIG. 1A, the conductive element 360 is not a conductive bump but an anisotropic conductive film (ACF), so the two contact pads 356 are not electrically connected to each other due to the properties of an anisotropic conductivity. The image sensor 300 is electrically connected to the two contact pads 356 through the ACF.

Figure 3B:
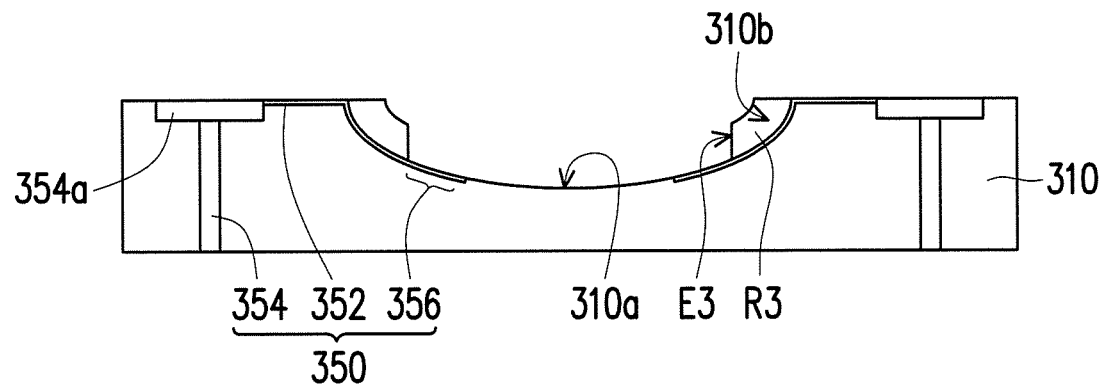
FIG. 3B to FIG. 3E are flow charts illustrating a method of manufacturing an image sensor according to an exemplary embodiment of the disclosure.
Figure 3C:
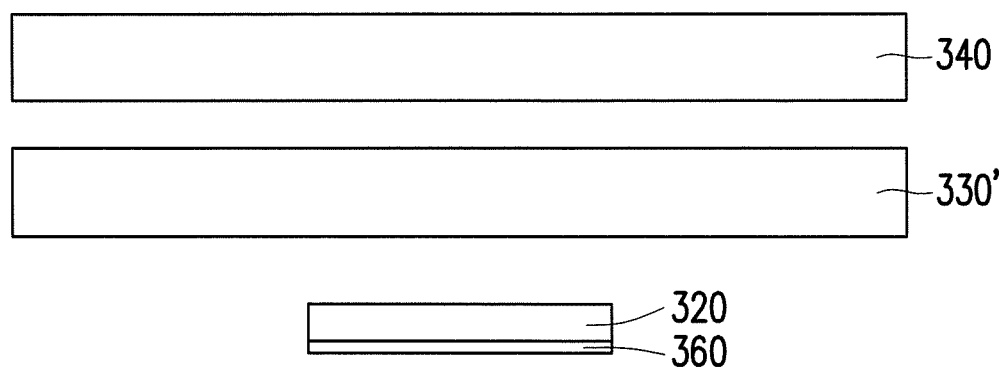
Figure 3D:
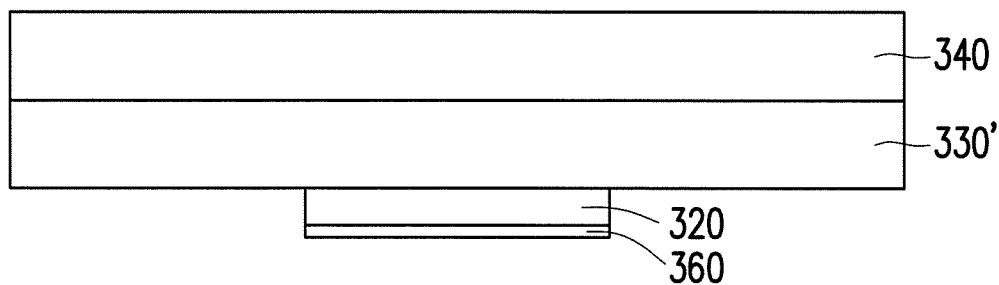

The image sensor 300 illustrated in FIG. 3A is taken for example to explain a manufacturing method of an image sensor according to an embodiment of the disclosure. FIG. 3B to FIG. 3E are flow charts illustrating a manufacturing method of an image sensor according to an embodiment of the disclosure. First, as shown in FIG. 3B, a substrate 310 is provided, and the substrate 310 has an arc surface 310a. Next, as shown in FIG. 3C, a cover 340, an adhesive layer 330', and an image sensing element 320 are provided. The adhesive layer 330' is, for example, a non-conductive film (NCF), but the disclosure is not limited thereto. Then, as shown in FIG. 3D, the adhesive layer 330' is bonded between the cover 340 and the image sensing element 320.

Figure 3E:
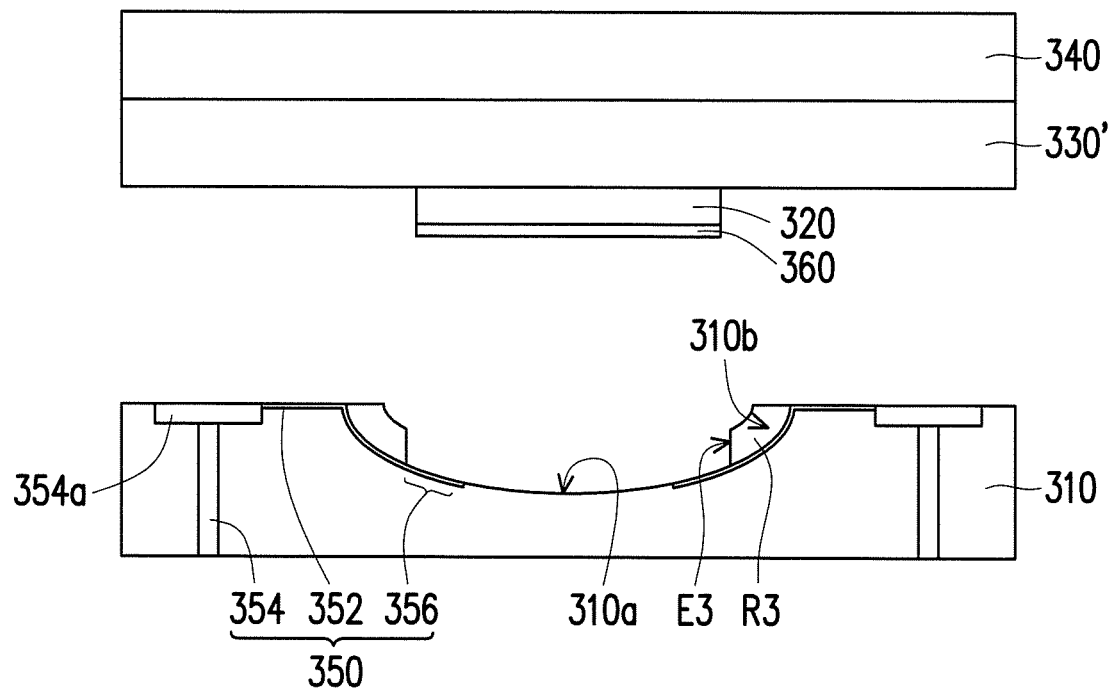

Finally, as shown in FIG. 3E, the cover 340, the adhesive layer 330', and the image sensing element 320 bonded together are aligned to the substrate 310, and the cover 340, the adhesive layer 330' and the image sensing element 320 are pressed onto the substrate 310, which is shown in FIG. 3A. Thereby, the image sensing element 320 is pressed by the adhesive layer 330' and thus is curved to fit the contour of the arc surface 310a of the substrate 310, and the image sensing element 320 is encapsulated by the adhesive layer 330. During the process, the image sensing element 320 is curved, so that a curvature of the image sensing element 320 is substantially identical to a curvature of the arc surface 310a. The image sensing element 320 is positioned in the positioning recess fainted by the end E3 of the flange R3, such that a bottom of the image sensing element 320 is completely supported by the arc surface 310a. The image sensing element 320 and the contact pad 356 of the conductive structure are electrically connected to each other by the conductive element 360. A groove of the substrate 310 is filled by the adhesive layer 330. The image sensing element 320 and the adhesive layer 330 are covered by the cover 340. In addition, after the cover 340, the adhesive layer 330, and the image sensing element 320 are pressed onto the substrate 310, the cover 340 may be further removed, and the disclosure is not limited thereto. In FIG. 3C to FIG. 3E, the adhesive layer that is not yet to be pressed is represented by the reference number 330', while the pressed adhesive layer that fills the groove of the substrate 310 in FIG. 3A is represented by the reference number 330. The embodiment provides that a material of the image sensing element 320 may include silicon, a thickness of the image sensing element 320 is, for example, smaller than 200 microns, and a bonding temperature of the image sensing element 320 is, for example, 100° C. to 200° C., but the disclosure in not limited thereto.

Figure 3F:
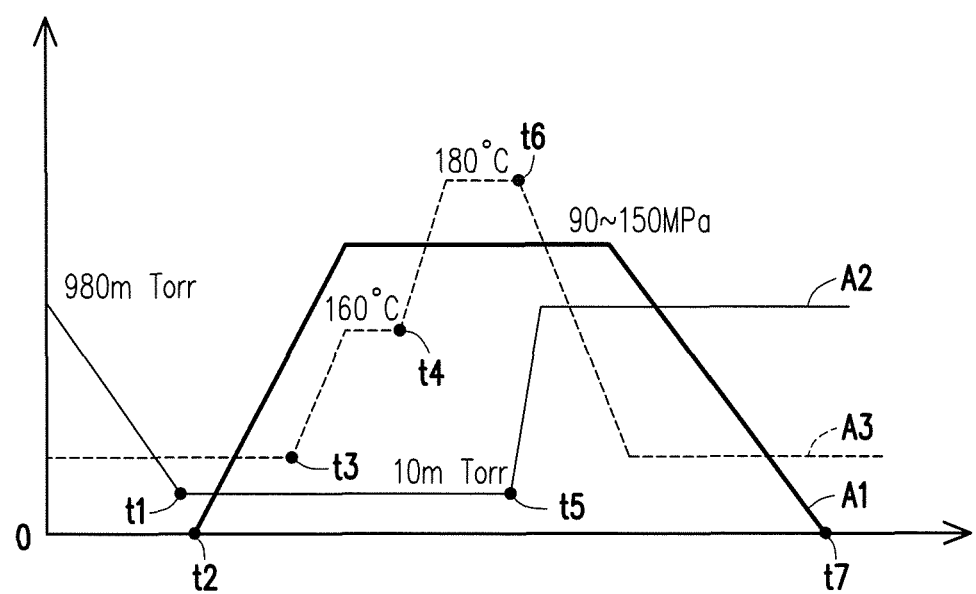
FIG. 3F illustrates variations of a chamber pressure, a bonding force, and a temperature during a manufacturing process of the image sensor in FIG. 3A.

FIG. 3F illustrates variations of a chamber pressure, a bonding force, and a temperature during a manufacturing process of the image sensor in FIG. 3A. In FIG. 3F, a vertical axis of each line segment A1, A2, and A3 represents the chamber pressure, the bonding force, and the temperature, respectively, and a horizontal axis represents time. Referring to FIG. 3F, specifically, before the cover 340, the adhesive layer 330, and the image sensing element 320 are pressed onto the substrate 310, a vacuum is created in an operation environment at time t1. Next, the cover 340, the adhesive layer 330', and the image sensing element 320 begin to contact the substrate 310 at time t2, and the bonding force is gradually increased. At time t3, the temperature begins to increase, and the adhesive layer 330' is heated and melted and fills the groove in the substrate 310. The melted adhesive layer 330' is partially removed along a groove 310b for overflowed adhesive. At time t4, the temperature further increases, and the conductive element 360 (ACF) is heated, melted, and then electrically connected to the image sensing element 320 and a conductive structure 350. At time t5, the chamber pressure is returned to atmosphere from a vacuum state. At time t6, the temperature begins to decrease, and the melted adhesive layer 330 is cooled down and solidified and encapsulates the image sensing element 320. At time t7, the bonding force is stopped, and the manufacture of the image sensor 300 is completed.

Figure 4:
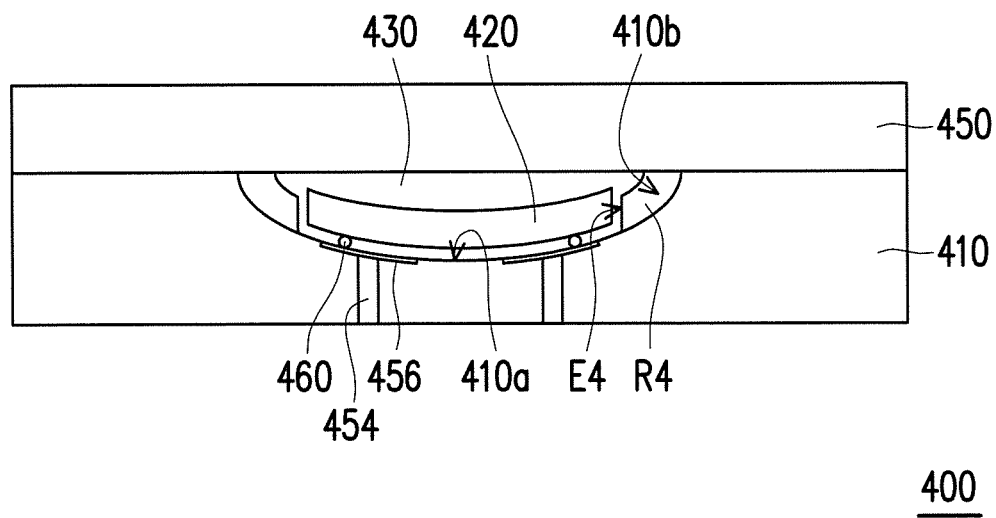
FIG. 4 is a cross-sectional view illustrating an image sensor according to another exemplary embodiment of the disclosure.

FIG. 4 is a cross-sectional view illustrating an image sensor according to another exemplary embodiment of the disclosure. The exemplary embodiment as illustrated in FIG. 4 provides that a substrate 410, an arc surface 410a, an groove 410b for overflowed adhesive, an image sensing element 420, an adhesive layer 430, a cover 440, a contact pad 456, a conductive element 460, a flange R4, and an end E4 are disposed and operated in a manner similar to that of the substrate 110, the arc surface 110a, the groove 110b for overflowed adhesive, the image sensing element 120, the adhesive layer 130, the cover 140, the contact pad 156, the conductive element 160, the flange R1, and the end E1 shown in FIG. 1A. Thus, details are not repeated hereinafter. A difference between an image sensor 400 and the image sensor 100 is that the two conductive plugs 454 of the conductive structure are directly connected to the two contact pads 456 and penetrate the substrate 410 from the inside of the arc surface 410a to the bottom of the substrate 410, but the disclosure is not limited thereto.

Figure 5:
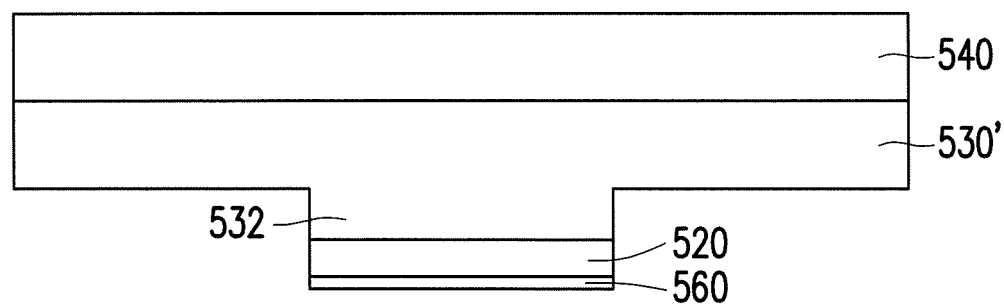
FIG. 5 illustrates a cover, an adhesive layer, and an image sensing element according to an exemplary embodiment of the disclosure.

FIG. 5 illustrates a cover, an adhesive layer, and an image sensing element according to an exemplary embodiment of the disclosure. In FIG. 5, a cover 540, an adhesive layer 530', an image sensing element 520 and a conductive element 560 are disposed and operated in a manner similar to that of the cover 340, the adhesive layer 330, the image sensing element 320, and the conductive element 360 shown in FIG. 3D. Thus, details are not repeated hereinafter. A difference between an embodiment in FIG. 5 and the embodiment in FIG. 3D is that an adhesive layer 530' that is not yet to be pressed onto the substrate has a mesa 532 corresponding to the image sensing element 520, and the image sensing element 520 is further reliably pressed onto the substrate through the mesa 532.

In view of the foregoing, not only the image sensing element but also the adhesive layer encapsulating the image sensing element is disposed on the arc surface of the substrate in the image sensor in the disclosure. Therefore, during a process of pressing the image sensing element and the adhesive layer onto the arc surface of the substrate, the adhesive layer pushes against the image sensing element, and the image sensing element may thus be curved to fit the contour of the arc surface. Compared to the conventional image sensing element that is curved by air extraction, the image sensing element in the disclosure requires no through hole to be formed on the arc surface of the substrate, thus simplifying the manufacturing process and saving the manufacturing costs. In addition, in view of the foregoing, since no through hole has to be formed on the substrate in the disclosure, a structure of the substrate is intact and thus is able to firmly support the image sensing element. Furthermore, since the image sensing element is encapsulated by the adhesive layer, foreign substances are prevented from being attached to the image sensing element during the manufacturing process.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An image sensor, comprising:
   a substrate, having an arc surface;
   an image sensing element, disposed on the arc surface, wherein the image sensing element is curved to fit a contour of the arc surface; and
   an adhesive layer, disposed on the arc surface and encapsulating the image sensing element,
   wherein the substrate has a top surface surrounding the arc surface, and the top surface of the substrate and a top surface of the adhesive layer are coplanar.

2. The image sensor as claimed in claim 1, wherein a curvature of the image sensing element is substantially identical to a curvature of the arc surface.

3. The image sensor as claimed in claim 1, comprising a cover, wherein the cover is disposed on the substrate and covers the image sensing element and the adhesive layer.

4. The image sensor as claimed in claim 1, wherein the arc surface is a concave arc surface and forms a groove on the substrate.

5. The image sensor as claimed in claim 4, wherein the adhesive layer fills the groove.

6. The image sensor as claimed in claim 1, wherein the substrate has no through hole at the arc surface.

7. The image sensor of as claimed in claim 1, wherein the substrate has at least one groove for overflowed adhesive, and the groove for overflowed adhesive extends from a periphery of the image sensing element to an edge of the arc surface.

8. The image sensor as claimed in claim 7, wherein a number of the at least one groove for overflowed adhesive is plural, the arc surface has a plurality of flanges surrounding the image sensing element, and the flanges are arranged with intervals to form the grooves for overflowed adhesive.

9. The image sensor as claimed in claim 8, wherein ends of the flanges surround the image sensing element and form a positioning recess, and the image sensing element is positioned in the positioning recess.

10. The image sensor as claimed in claim 7, comprising a conductive structure, wherein the conductive structure extends along the groove for overflowed adhesive to an outside of the arc surface.

11. The image sensor as claimed in claim 1, comprising a conductive structure, wherein the conductive structure is disposed on the substrate, electrically connected to the image sensing element, and extends from a bottom of the image sensing element to an outside of the arc surface.

12. The image sensor as claimed in claim 11, wherein the substrate has an upper side and a lower side opposite to the upper side, the arc surface is located on the upper side of the substrate, and the conductive structure penetrates the substrate from an inside or an outside of the arc surface to the lower side of the substrate.

13. The image sensor as claimed in claim 11, wherein the conductive structure comprises at least one of a conductive plug and a conductive circuit.

14. The image sensor as claimed in claim 11, comprising at least one conductive element, wherein the at least one conductive element is disposed between the image sensing element and the arc surface and electrically connects the image sensing element and the conductive structure.

15. The image sensor as claimed in claim 14, wherein the at least one conductive element is a conductive bump or an anisotropic conductive film.

16. An image sensor, comprising:
   a substrate, having an arc surface;
   an image sensing element, disposed on the arc surface, wherein the image sensing element is curved to fit a contour of the arc surface;
   an adhesive layer, disposed on the arc surface and encapsulating the image sensing element; and
   a cover, disposed on the substrate and covering the image sensing element and the adhesive layer,
   wherein the substrate has a top surface surrounding the arc surface, and the top surface of the substrate and a top surface of the adhesive layer are coplanar, and a maximum distance between a top surface of the image sensing element and the cover is smaller than a thickness of the cover.

* * * * *